United States Patent
Comino et al.

[11] Patent Number: 5,914,633
[45] Date of Patent: Jun. 22, 1999

[54] METHOD AND APPARATUS FOR TUNING A CONTINUOUS TIME FILTER

[75] Inventors: Vittorio Comino, Keansburg; Dima David Shulman, Marlboro; Susan Jeanne Walker, Howell, all of N.J.

[73] Assignee: Lucent Technologies Inc.

[21] Appl. No.: 08/906,912

[22] Filed: Aug. 8, 1997

[51] Int. Cl.⁶ .............................. H03K 5/00; H03M 1/12
[52] U.S. Cl. .................... 327/553; 327/552; 333/172; 330/305
[58] Field of Search ...................... 327/552, 553, 327/554, 311; 333/172, 173; 330/303, 305

[56] References Cited

U.S. PATENT DOCUMENTS 5,245,646 9/1993 Jackson et al. .......................... 327/553

FOREIGN PATENT DOCUMENTS 36211707 5/1987 Japan ..................................... 327/553

*Primary Examiner*—Timothy P. Callahan
*Assistant Examiner*—Dinh Le
*Attorney, Agent, or Firm*—Darby & Darby

[57] ABSTRACT

A tuning circuit for generating a digital code to be used to calibrate a capacitor array of the type used in active RC filters is comprised of a single-slope A/D converter with fixed reference voltages as inputs and an output value which is dependent on the RC product of a resistor and capacitor within the converter. A decoder converts the RC product as measured by the A/D converter into a digital code which, when applied to the appropriate capacitor array, sets the array capacitance to compensate for the difference between the measured RC product and the nominal design value.

9 Claims, 3 Drawing Sheets

METHOD AND APPARATUS FOR TUNING A CONTINUOUS TIME FILTER

TECHNICAL FIELD

This invention is related to tuning active filters. More particularly, this invention relates to a method and apparatus for tuning the capacitors in an active RC filter.

BACKGROUND OF THE INVENTION

Tunable RC filters are relatively new varieties of active continuous time filters and are useful for various low to medium frequency applications. Active RC filters are constructed from resistors, capacitors, and integrated amplifiers. For low to medium frequency applications, the amplifiers can be treated as having essentially infinite gain and input impedance. Because little or no current is drawn by the amplifiers, the amplifier inputs function as virtual grounds and substantially all of the input signal is applied to the resistors and capacitors. Thus, the operating characteristics of the filter are determined by the various RC products.

It is advantageous to be able to implement this type of filter as a monolithic integrated circuit. However, because of processing and temperature variations, the value of individual components may vary by as much as ±30%. It is not unusual for the RC product of on-chip components, and thus the frequency response of the filter, to vary by up to 50% from the nominal design value. One conventional solution has been to use integrated amplifiers in conjunction with high-precision, external resistors and capacitors. This solution increases both the size and the cost of the resulting filter.

Another solution is to provide for a fully integrated filter with an RC product that can be tuned to account for various process, temperature, and power supply variations. One method for doing this, is to replace passive resistors with active resistors made with MOSFET technologies. Y. P. Tsividis, "Integrated Continuous-Time Filter Design—An Overview, " *IEEE J. Solid-State Circuits,* vol. 29, pp. 166–176, March 1994. The filter is tuned by adjusting the resistance of the MOS resistors to achieve the desired RC value. For example, a feedback circuit may be implemented which continuously measures the RC product of the filter with reference to e.g., a clock or an external high-precision resistor. The outputs of the tuning circuit are then continuously applied to the MOSFET devices to set their resistances.

A disadvantage to this technique is that the tuning circuits are very complex, sometimes more complex than the filter itself. Another substantial drawback to this approach is that the inputs to the MOSFET resistors must be analog signals and thus must be continuously generated. The tuning circuit is therefore always drawing power. Further, this approach has serious drawbacks when low supply voltages of 2.4 volts to as low as 1 volt are used, a condition common in many battery operated devices. MOS transistors typically become conducting when a bias voltage of about one volt is applied. When low supply voltages are used, these devices do not have enough variable range to compensate for expected manufacturing variations of the filter components.

An alternative to this technique is to make tunable filters by using tunable capacitor arrays and linear, passive resistors in place of active, non-linear MOSFET resistors. A. M. Durham, J. B. Hughes and W. Redman-White, "Circuit Architectures for High Linearity Monolithic Continuous-Time Filtering," *IEEE Transactions on Circuits and Systems—II: Analog and Digital Signal Processing,* Vol. 39, No. 9, September 1992, pp. 651–57. The techniques proposed to tune capacitor arrays involve measuring the RC product of the array and comparing this value with the nominal design value. The number of active capacitors in the array is adjusted to keep the circuit near the nominal design for the RC product. Because passive resistors are used instead of MOSFET devices, the filter is highly linear. Furthermore, while the inputs to the MOSFET devices are analog, the inputs to the capacitor array are digital. Consequently, the tuning circuits that feed capacitor arrays generate digital outputs. Once the array has been calibrated, the resulting digital code can be latched while the rest of the tuning circuitry is powered down. The accuracy of the tuning process is necessarily limited by the number of bits in the digital code and consequently the number of controllable elements in the capacitor array. For many low frequency applications, an accuracy of ±5% to ±10% for the 3 dB point of the filter's frequency response is sufficient.

Conventional techniques for measuring the RC product involve using a dual-slope A/D convertor (see, e.g., Durham, et al., above) or switching and current mirror techniques. A. Durham and W. Redman-White, "Integrated Continuous-Time Balance Filters for 16-b DSP Interfaces," *IEEE Journal of Solid State Circuits,* Vol. 28, No. 7, July 1993, pp. 835–839. These tuning techniques are unnecessarily complex.

Thus, it is an object of the present invention to provide a simple and low-power tuning circuit which can calibrate a capacitor array to a high degree of accuracy.

Yet another object of the present invention is to provide a tuning circuit which can utilize electrical components of the filter to be tuned when the filter is not in operation.

SUMMARY OF THE INVENTION

A simplified tuning circuit according to the present invention is based on measuring the RC product of a resistor and capacitor under given process and temperature conditions, and translating this value into a digital code which is used to control the capacitance of a capacitor array in an active RC filter. Once the array has been calibrated, the digital code can be latched while the rest of the tuning circuitry is powered down. The circuit is not based on feedback, making the design straightforward.

In essence, the circuit measures an analog value which is related to the RC product of the filter. This quantity is then converted by logic circuitry into a digital code which represents how the capacitor array should be tuned. To convert the analog value into a digital code requires a sensor and an A/D converter. These two functions are advantageously combined in a single-slope A/D converter.

Single-slope A/D converters are rarely used in practical applications because their accuracy depends on an RC product. When this type of converter is used, conventional applications employ external, high-precision resistors and capacitors which result in a very accurate RC constant. Most often, dual-slop A/D converters, which are not dependent on RC products, are used instead.

The tuning circuit according to the present invention is based on this "drawback" present in single-slope A/D converters. This device is an integrating-type converter which first converts the analog input into a pulse which is then applied to a counter. The counter generates a digital code based on the pulse width and an applied clock signal. The A/D converter is comprised of an operational amplifier ("op-amp") arranged as an integrator with an output signal whose slope depends on the RC product of the integrator components.

The output of the integrator is applied to the inputs of two comparators whose outputs are applied to a logic circuit. By choosing appropriate voltage reference signals as the second input to the comparators and an appropriate logic circuit, the output is a pulse with a width proportional to the RC product being measured. This pulse is converted into a digital value by, e.g., timing its duration with a counter. This value represents the measured RC value and therefore can be used to determine how much the actual RC constant differs from the nominal designed value.

A conventional decoder can then be used to determine how a capacitor array should be configured to compensate for the measured difference in the actual RC product from the nominal value. The result is a digital code which can be stored and applied to the array. A five bit A/D convertor used according to the invention can typically achieve results within ±3% of the nominal RC product. Greater accuracy can be achieved by using higher-resolution A/D converters and a capacitor array with more elements. While the single-slope A/D convertors can be relatively slow, speed during filter calibration is not an issue in many applications.

BRIEF DESCRIPTION OF THE DRAWINGS

The foregoing and other features of the present invention will be more readily apparent from the following detailed description and drawings of illustrative embodiments of the invention in which:

FIG. 2b is a schematic of a voltage divider used to generate reference voltages for the tuning circuit of FIG. 2a.

DETAILED DESCRIPTION

Figure 1A:
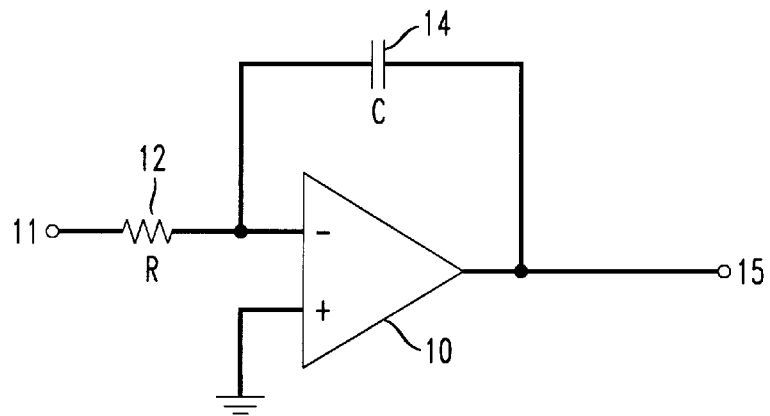
FIG. 1a is a generic schematic diagram of an active RC filter

FIG. 1a is a schematic illustration of a generic integrating component for an active filter. The filter component is comprised of an op-amp 10, a resistor 12, and a capacitor 14. An input signal is applied to node 11 and the output is taken from node 15. For low and medium frequencies (less than 100 KHz), the op-amp 10 can be considered to have infinite input impedance and gain. Thus, the frequency response of this circuit is dependent on the RC product of resistor 12 and capacitor 14. When this filter is implemented as a monolithic integrated circuit, the value of the RC product will vary depending on temperature and processing variations. To use a monolithic active RC filter for precision applications, the RC product must therefore be tunable to compensate for these variations.

Figure 1B:
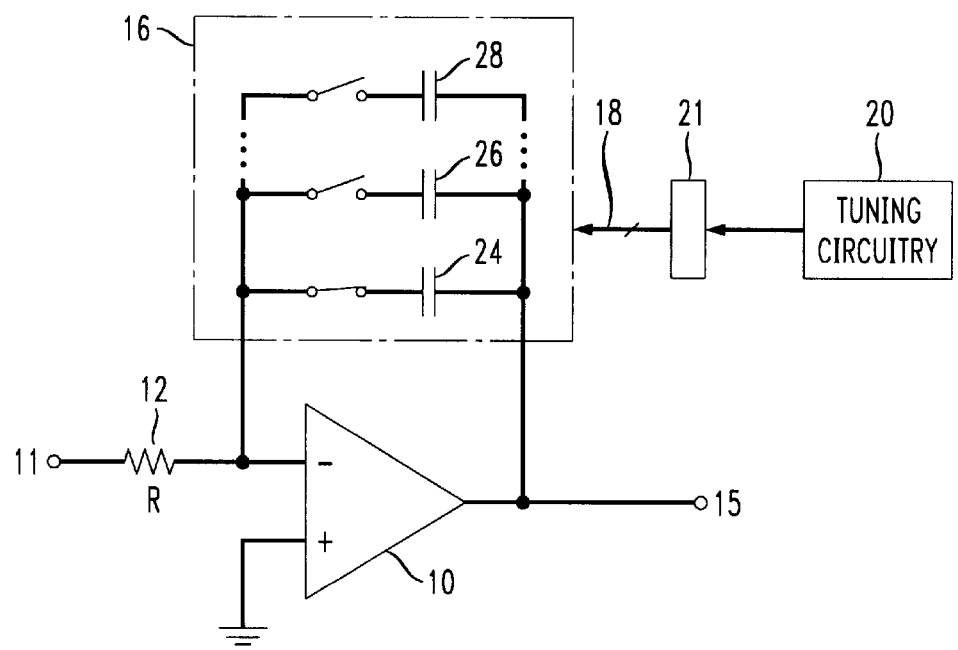
FIG. 1b is the circuit of FIG. 1a with the capacitor formed by a capacitor array whose capacitance is determined by a tuning circuit.

A variable RC product is provided by replacing capacitor 14 with tunable capacitor array 16 (comprised of independently selectable capacitors 24, 26, 28) as shown in FIG. 1b. The capacitance of the array 16 is determined by a digital code 18 which is generated by a tuning circuit 20 and stored in latches 21.

Figure 2A:
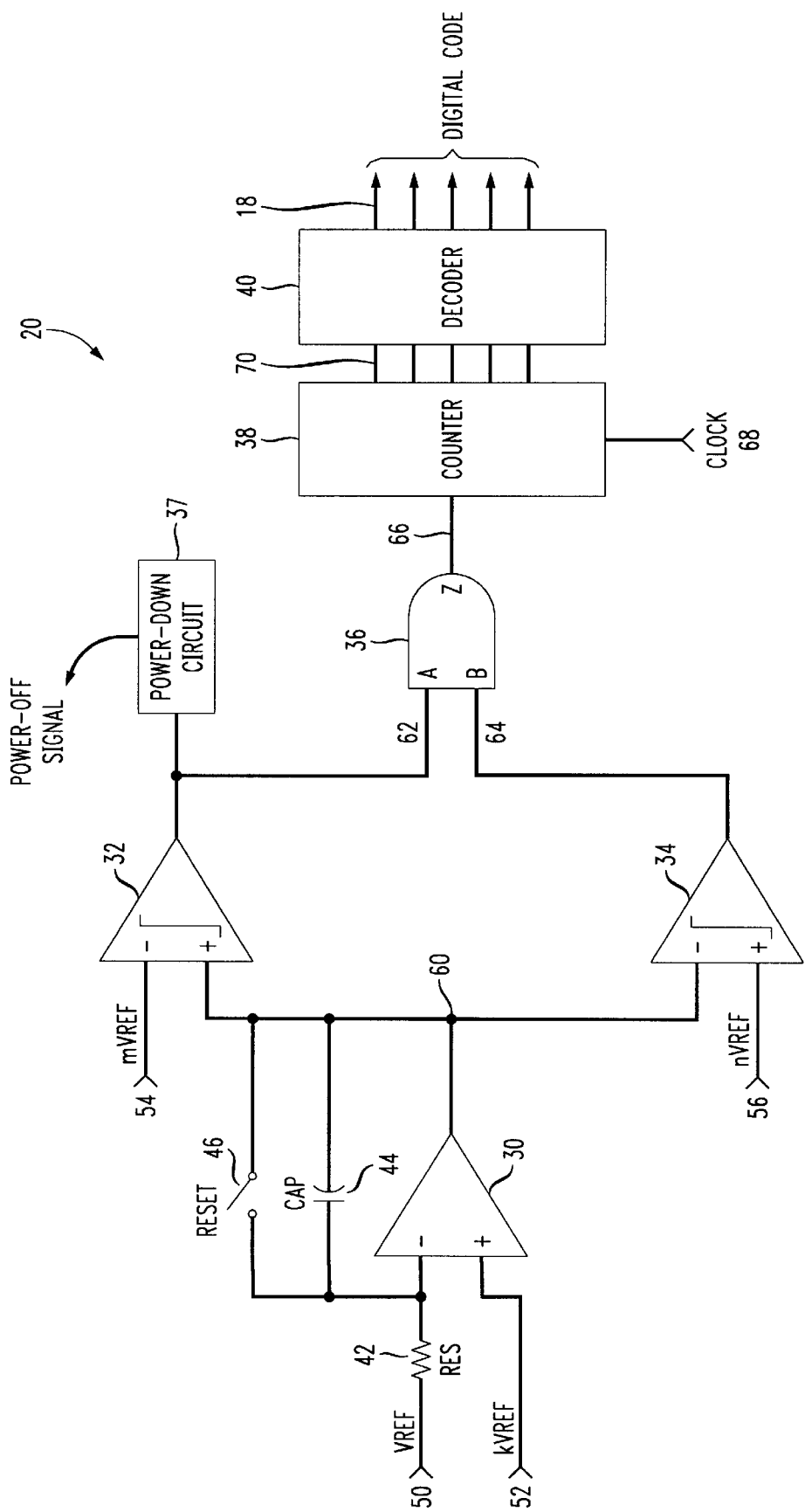
FIG. 2a is a schematic diagram of a tuning circuit according to the present invention.

FIG. 2a is a schematic illustration of the tuning circuit 20 according to the present invention. Tuning circuit 20 is comprised of an op-amp 30, two comparators 30, 32 connected to logic circuit 36, counter 38, and decoding logic 40. Reference voltages VREF, k*VREF, m*VREF, and n*VREF are applied to input nodes 50, 52, 54, and 56 respectively. Op-amp 30 is configured as an integrator with input resistor 42 connected between the inverting input and input node 50, negative feedback capacitor 44, and reset switch 46 in parallel with capacitor 44. The non-inverting input is connected to input node 52.

The tuning operation starts by momentarily closing reset switch 46 to short out the capacitor 44 and reset the integrator. Reference voltage VREF is applied to input node 50 and voltage k*VREF is applied to input node 52. Because the inverting input of op-amp 30 functions as a virtual ground, the voltage level at the inverting input is also set to k*VREF when the switch 46 is closed. After the resetting operation is terminated and the switch 46 is opened, capacitor 44 will begin to charge and integrator output 60 will drop. The output 60 of the integrator has a slope given by the equation:

$$\frac{\Delta V}{\Delta t} = \frac{VREF - k * VREF}{RC} \quad \text{(a)}$$

Setting voltage k*VREF less than VREF causes the integrator output to be a declining voltage ramp. This arrangement advantageously allows all the reference voltages to be generated from VREF. However, it is possible to generate a rising voltage ramp as output from the integrator if VREF is smaller than k*VREF.

Integrator output 60 is applied to the positive input of comparator 34 and reference voltage n*VREF, which is less than k*VREF in this embodiment, is applied to the negative input node 56. The output of comparator 34 is therefore a step function which makes the transition from low to high when integrator output 60 drops below reference voltage n*VREF. The output 60 of op-amp 30 is also applied to the positive input of comparator 32 and reference voltage m*VREF, which is less than reference voltage n*VREF in the embodiment, is applied to the negative input node 54. The output of comparator 32 is therefore a step function which makes the transition from high to low when integrator output 60 drops below m*VREF.

The outputs of the comparators 32, 34 are applied to inputs 62, 64 of logic circuit 36. In the preferred embodiment, logic circuit 36 is an AND gate. The output 66 of logic circuit 36 will thus be high only when the value of integrator output 60 is between n*VREF and m*VREF. One skilled in the art would recognize that the choice of logic gate 36 and the configuration of comparators 32 and 34 is dependent on whether the integrator is configured to have a downward or upward sloping output voltage and on whether positive or negative logic is to be used.

This arrangement functions as a pulse generator and will produce a pulse at output 66 with a duration given by:

$$\Delta t = RC\left(\frac{n * VREF - m * VREF}{VREF - k * VREF}\right) = RC\left(\frac{n - m}{1 - k}\right) \quad \text{(b)}$$

The pulse width produced by this circuit is proportional to the RC product and is independent of reference voltage VREF.

Figure 2B:
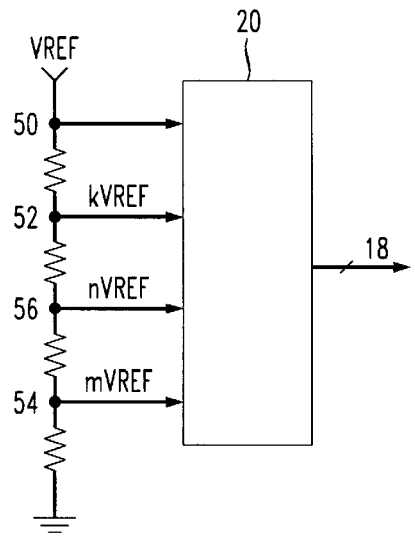

The four reference voltages applied to input nodes 50, 52, 54, and 56 may be derived from a single reference voltage VREF. One way to generate these voltages is to apply voltage VREF to a resistive divider as shown in FIG. 2b. The tuning circuit is dependent on the voltage ratios, not the actual magnitude of the derived voltage and therefore, VREF does not need to be very accurate. However, to improve accuracy, the difference between n*VREF and m*VREF should be as large as possible.

Returning to FIG. 2a, the counter 38 has a digital output 70 which is a function of the pulse width, which output 70 is the digital output of the single-slope A/D converter. In the preferred embodiment, the duration of the pulse is determined relative to clock input signal 68, and therefore, the determined pulse duration is proportional to the pulse width and thus the RC product. The difference between the predicted and expected pulse width can be used to determine how much the capacitance of array 16 (FIG. 1b) must be adjusted to provide the proper RC product for the filter.

The measured RC product, which is indicated by the counter output 70, is input to a decoder 40 which generates a digital code 18 related to a comparison of the actual pulse duration with the calculated duration. Code 18 is applied to array 16 and tunes the filter to the proper operating point. Once the digital code 18 is determined, it can be stored in latch 21 (FIG. 1b) while the analog circuitry is shut down to conserve power.

The analog portion of the tuning circuit comprising op-amp 30, comparators 32, 34, and the reference voltage bias circuit may be shut down automatically when the RC product has been measured by using power-down circuit 37. In the preferred embodiment, power-down circuit 37 is connected to the output of comparator 32 and switches off the power when comparator 32 indicates that the integrator output voltage has dropped below m*VREF and thus, that the measurement of the RC product is complete. (The signals from power-down circuit 37 for switching the power on and off are not shown for clarity).

In the preferred embodiment, the values of the reference voltages in the integrator are chosen based on the speed of the clock applied to the counter and the nominal value of the RC product for the integrator. The chosen nominal RC product for the integrator must be large enough to match other RC products on the same chip. The clock speed should be chosen based on the nominal RC product, but should not be too fast relative to the speed of the comparators. With a large nominal RC product, the value of 1-k should also be large. However, the difference between n and m should be great enough so that offset errors in the comparators are not significant. The values of n, m, and k should also be chosen so that the output of the counter will be approximately the mid-range of the A/D converter when the measured RC product equals the nominal value. This will provide the widest ± range of variability. For example, a 5-bit A/D converter has an output value which ranges from 0–31. The values of the applied reference voltages should be chosen so that the nominal RC product is measured by the counter as approximately 16.

The type of decoding scheme used to translate the measured RC product to a calibration code is dependent on how the capacitor array is structured. The various considerations are discussed by Durham, et al. in the IEEE papers cited above. The decoding scheme for the present invention is derived from the equations developed by Durham, et al. but differs somewhat from that technique. In particular, the digital code "num" of a capacitor array is given by equation 2, p. 836 of the Durham Redman-White 1993 article cited above, as follows:

$$num = \frac{2^{N-1}}{\Delta_r} * \frac{100}{x} - 2^{N-1} * \left(\frac{100}{x} - 1\right) - 0.5 \tag{c}$$

where N is the number of switchable binary-weighted capacitor elements in the array (i.e., the number of bits of resolution), x is the expected percentage range of variability for the RC product, and num corresponds to the digital code used for tuning. $\Delta_r$ is the ratio between the measured RC product and the ideal or nominal value. This ratio can be expressed as the actual RC product as measured by the counter, $n_{meas}$, divided by the expected count for a nominal RC product, $n_{nom}$.

For a possible 50% variation in the measured RC product from the nominal, x=50. From this, equation (c) can be reduced to:

$$num = \frac{2^N}{\Delta_r} - 2^N + [2^{N-1} - 0.5] \tag{d}$$

In an ideal situation, the measured and nominal RC product will be the same and thus $\Delta_r=1$. Ideally then, the applied code should correspond to the nominal measured RC product from the counter, $n_{nom}$, and thus the equation can be written as:

$$num = \frac{2^N}{\Delta_r} - 2^N + n_{nom} \tag{e}$$

For a five capacitor binary-weighted array, the tuning circuit needs 5 bits of accuracy. Thus $2^N =32$ and $n_{nom}$ is 16 (rounded up from 15.5). Substituting these valves, the equation reduces further to:

$$num = \frac{32}{n_{meas} \div 16} - 32 + 16 = \frac{512}{n_{meas}} - 16 \tag{f}$$

Since the nominal value for n is preset to 16, the range of $n_{meas}$ for a 50% range of variation of the RC product is 8 to 31, (i.e., 50% of 16). Therefore, the code, num for each of the values of $n_{meas}$ in this range can be calculated and a table can be created to map the measured RC product as represented by the counter output $n_{meas}$ to a corresponding code num. Using conventional logic design techniques, this table can be implemented as decoder 40.

Figure 3:
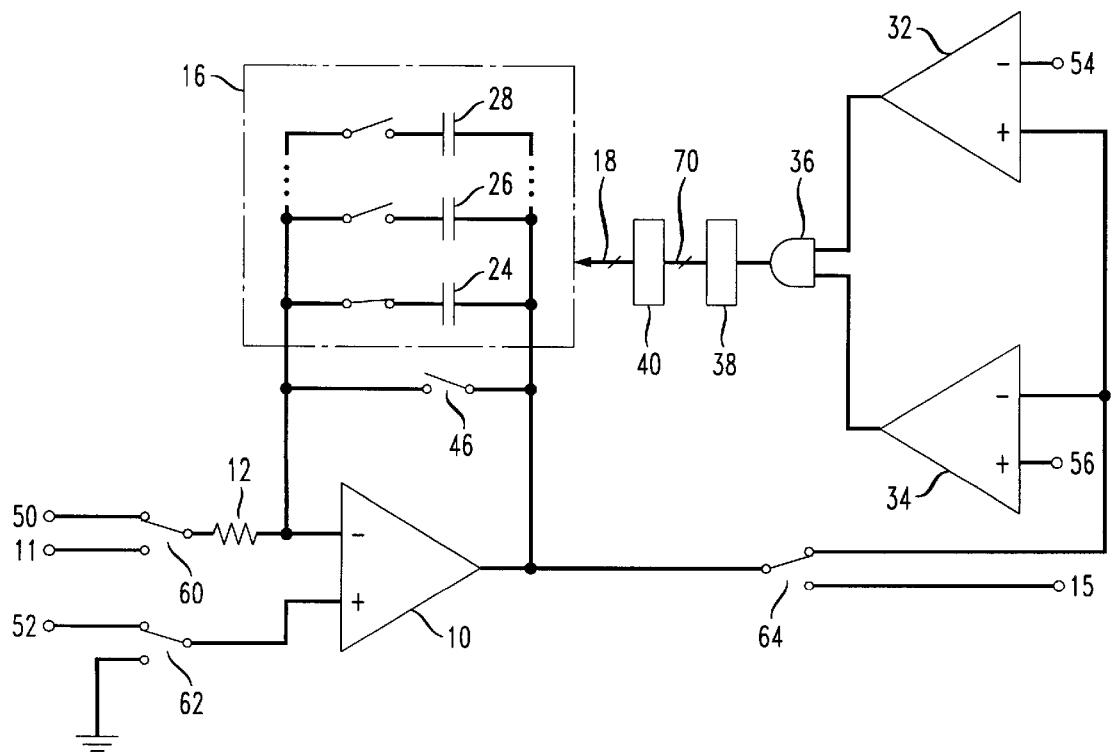
FIG. 3 is a schematic diagram of the tuning circuit of FIG. 2 combined with the active filter element of FIG. 1b.

It can be appreciated that the tuning circuit according to the present invention may advantageously share components with a filter on the same chip. Many active RC filters are comprised of one or more integrators, such as shown in FIGS. 1a and 1b, which are not operating during the calibration process. Thus, rather than build a single slope A/D convertor with separate components, an integrator which is part of the filter being tuned can be used instead. One method of "sharing" components is illustrated in FIG. 3. Through the use of switches 60, 62, and 64, the integrating component comprised of op-amp 10, resistor 12 and capacitor array 16 (as in FIG. 1b) may be disconnected from filter input 11 and output 15, and instead connected as the integrator part of a tuning circuit according to the present invention. (Note that a reset switch 46 must be added to the shared capacitor array from the filter).

This sharing technique not only reduces the area used by the tuning circuit but also minimizes errors caused by mismatches between components on the same IC, since the resistor 12 and at least one capacitor 24 from the array 16 of the actual filter being tuned are used to calibrate it. Once the tuning process is completed, the tuning circuitry can be switched off and the integrating element can be connected to the rest of the filter circuitry.

One skilled in the art would recognize that when components are shared between the filter and the tuning circuit, the shared op-amp used in the integrating A/D converter must have a gain sufficient for the required degree of tuning accuracy. Roughly, for N-bit A/D accuracy, the op-amp requires about 6*N dB of gain. For example, a 12-bit integrating A/D convertor requires an op-amp with about 72 dB of gain. For general application which require only 5 or 6 bits of accuracy, the required gain is much lower, about 30–40 dB. This gain requirement is easily met by op-amps which are commonly used in conventional active filters. Additionally, unlike the stand-alone tuning circuit discussed above, the RC components in the integrator cannot be independently chosen. The values of n, m, and k must therefore be determined according to the nominal value of the shared RC circuit in the filter.

While the invention has been particularly shown and described with reference to preferred embodiments thereof, it will be understood by those skilled in the art that various changes in form and details may be made therein without departing from the spirit and scope of the invention.

We claim:

1. A circuit combining an active RC filter and an integrating tuner wherein in a first state said circuit functions as a filter and in a second state said circuit functions as an integrating tuner and provides an output suitable for adjusting a total capacitance of an array of switched capacitors, said circuit comprising:

an amplifier having an inverting and a non-inverting input and an output;

a resistor connected between said inverting input and a first switch;

said non-inverting input connected to a first reference voltage; and a capacitor connected between the output of the amplifier and the non-inverting input;

a pulse generator receiving the output of the amplifier as input and providing a pulse signal as output, said pulse signal having a first output signal level when the pulse generator input has a magnitude between that of a second and a third reference voltage and otherwise having a second output signal level;

a counter receiving said pulse signal as input and providing a digital count as output, said digital count having a valve proportional to the width of a pulse present in said pulse signal; and a decoder receiving said digital count as input and providing a digital code as output;

wherein, when said circuit is in the first state, said first switch connects said resistor to a filter input, said amplifier, resistor, and capacitor comprise said active RC filter, the output of the amplifier providing a filtered version of a signal applied to said filter input; and when said circuit is in the second state, said first switch connects said resistor to a fourth reference voltage, said amplifier, resistor, and capacitor comprise an integrator having an RC time constant defined by said resistor and capacitor, said integrator, pulse generator, counter, and decoder comprise said integrating tuner, said digital count indicating the magnitude of the RC time constant, and said digital code indicating which of said plurality of capacitors in said array of switched capacitors is to be enabled so as to tune the total capacitance of said capacitor array in accordance with said RC time constant.

2. The circuit of claim 1, further comprising a reset switch connected in parallel with said capacitor.

3. The circuit of claim 1, wherein:

said capacitor array is connected between the output of the amplifier and the non-inverting input of the amplifier;

said digital code is applied to said capacitor array to adjust the total capacitance of said capacitor array in accordance with said RC time constant; and when in said first state, a frequency response of said active RC filter is dependent on the total capacitance of said capacitor array.

4. The circuit of claim 1, further comprising a second switch selectively connecting the output of the amplifier to said pulse generator when said circuit is in the second state.

5. The circuit of claim 1, further comprising a second switch connecting said non-inverting input to a ground voltage level when said circuit is in the first state and to said first reference voltage when said circuit is in the second state.

6. The circuit of claim 1, wherein said pulse generator comprises:

a first comparator receiving said pulse generator input and said second reference voltage as inputs and having a first comparator output;

a second comparator receiving said pulse generator input and said third reference voltage as inputs and having a second comparator output; and a logic circuit receiving said first and second comparator outputs and generating said digital pulse output signal as its output.

7. The circuit of claim 6, wherein:

said fourth reference voltage is greater than said first reference voltage, said first reference voltage is greater than said second reference voltage, and said second reference voltage is greater than said third reference voltage;

said second reference voltage is connected to a non-inverting input of said first comparator;

said third reference voltage is connected to an inverting input of said second comparator, and said logic circuit comprises an AND gate.

8. The tuning circuit of claim 1, wherein said first, second, third, and fourth reference voltages are generated by a voltage divider.

9. An integrated circuit combining an active RC filter and an integrating tuner, wherein in a first state said circuit functions as a filter and in a second state said circuit functions as an integrating tuner and provides an output suitable for adjusting the total capacitance of an array of switched capacitors each of which can be selectably enabled or disabled in response to a respective control signal, said circuit comprising:

an amplifier having an inverting and a non-inverting input and an output;

a resistor connected between said inverting input and a first switch;

said non-inverting input connected to a first reference voltage;

said capacitor array connected between the output of the amplifier and the non-inverting input;

a pulse generator receiving the output of the amplifier as input and providing a pulse signal as output, said pulse signal having a first output signal level when a voltage applied to said driving signal input has a magnitude between that of a second and a third reference voltage and otherwise having a second output signal level;

a counter receiving said pulse signal as input and providing a digital count as output, said digital count having a value proportional to the width of a pulse present in said pulse signal; and a decoder receiving said digital count as input and providing a digital code as output;

wherein, when said circuit is in the first state, said amplifier, resistor, and capacitor array comprise said active RC filter, the output of the amplifier providing a filtered version of a signal applied to said filter input, a frequency response of said filter being dependent on a number of said plurality of switched capacitors which are enabled; and when said circuit is in the second state, said switch connects said resistor to a fourth reference voltage, at least one of said switched capacitors in said capacitor array is enabled, and said amplifier, resistor, and said at least one enabled capacitor comprise an integrator having an RC time constant defined by said resistor and said at least one enabled capacitor, said integrator, pulse generator, counter, and decoder comprise said integrating tuner, said digital count indicating the magnitude of the RC time constant, said digital code indicating which of said plurality of capacitors in said array is to be enabled when the circuit is in the first state so as to adjust the frequency response of said active RC filter in accordance with said RC time constant.

* * * * *